United States Patent [19]
Lim et al.

[11] Patent Number: 5,155,578
[45] Date of Patent: Oct. 13, 1992

[54] BOND WIRE CONFIGURATION AND INJECTION MOLD FOR MINIMUM WIRE SWEEP IN PLASTIC IC PACKAGES

[75] Inventors: Thiam B. Lim; Soon C. Lian, both of Singapore, Singapore

[73] Assignee: Texas Instruments Incorporated, Dallas, Tex.

[21] Appl. No.: 691,764

[22] Filed: Apr. 26, 1991

[51] Int. Cl.⁵ .................. H01L 23/02; H01L 23/12
[52] U.S. Cl. ........................ 357/74; 357/68; 357/72; 381/421; 174/52.4; 439/68; 439/70
[58] Field of Search ............ 357/74, 72, 68; 361/421; 174/52.4; 439/68, 70, 76

[56] References Cited

U.S. PATENT DOCUMENTS

| | | |
|---|---|---|
| 3,611,061 | 10/1971 | Segerson ............... 357/75 |
| 4,618,879 | 10/1986 | Mizukoshi et al. ...... 357/74 |
| 4,768,070 | 8/1988 | Takizawa et al. ....... 357/19 |
| 4,890,153 | 12/1989 | Wu .................... 357/74 |
| 4,916,506 | 4/1990 | Gagnon ................ 357/74 |
| 4,959,706 | 9/1990 | Cusack et al. ......... 357/70 |

Primary Examiner—Rolf Hille
Assistant Examiner—David Ostrowski
Attorney, Agent, or Firm—Gary C. Honeycutt; Richard Donaldson; William E. Hiller

[57] ABSTRACT

The degree of wire sweep and wire clearance over the buss bars in the 16 Mega Bit LOC package is found to be dependent on the angle of the bond wires. A positive wire angle range of 5 to 15 degrees is recommended for minimum wire sweep and maximum wire clearance over the buss bars. This is so because they offer the least resistance to the flow of the mold compound during transfer molding. A staggered gating system ensures that the wire angles in all cavities are positive with respect to the gate. This invention is also applicable to conventional packages.

3 Claims, 2 Drawing Sheets

BOND WIRE CONFIGURATION AND INJECTION MOLD FOR MINIMUM WIRE SWEEP IN PLASTIC IC PACKAGES

BACKGROUND OF THE INVENTION

This invention relates to a method and structure for the encapsulation of microelectronic circuits by injection molding, while minimizing the distortion of bonding wire geometry.

The flow of a plastic melt into a mold cavity during the molding or encapsulation of a plastic IC package exerts forces sufficiently high as to displace or deform the bond wires. Generally referred to in the industry as "wire sweep", this is the predominant cause of defects in the molding of IC packages. Wire sweep is defined as the linear deviation of the bond wire from a straight line drawn between the bond pad and the lead frame as projected on the plane of the leadframe.

The ensuing wire deformation can cause adjacent bond wires to come into contact with each other, or they may collapse onto an electrically active part of the chip, both of which cause the device to be electrically shorted.

High density circuits such as 16 Mega Bit memory devices use the newly developed lead-on-chip (LOC) packaging technology wherein the bond pads are located at the centre of the chip. This poses added difficulties since the bond wires need to span over the power buss bars to be bonded to the lead fingers. There are risks of shorting between adjacent wires, and shorting to the power buss bars.

The mechanics of wire sweep and the often interrelated factors affecting the viscous fluid flow are complex. However, some of the factors found to influence wire sweep can be summarized as follows:

1. Mold design—a runner and gating system in which filling is simultaneous in all cavities and allows the individual fill rate to be reduced, thereby avoiding cavity filling rush in the first and the last cavities. It is the fluid velocity within the cavity that deflects the wires.
2. Plastic flow imbalance between the 2 cavity halves—flow in one half is faster than the other, causing the leadframe to tilt thereby subjecting each wire to both tensile and bending forces.
3. Air vent design—this needs to be strategically located such that it is not blocked by the flow of the plastic. A blockage will entrap air which, when compressed by the packing action, can induce wire deflection.
4. Viscosity of the plastic melt—the forces exerted on the bond wires increase with the viscosity of the flowing plastic thereby increasing the degree of wire sweep.
5. Wire and wire material—for a given force a larger wire diameter is naturally more resilient to deformation but this would increase material cost, especially if gold wire is used. A small addition of beryllium to gold increases the elastic property of the wire in the annealled condition such that it increases the elastic energy under its stress-strain cure. This has the effect of minimizing the overall wire sweep since a larger portion of wire sweep due to elastic deformation is now recoverable.
6. Molding parameters—preform preheat time/temperature, mold temperature, transfer pressure and transfer time have very important impact on wire sweep:
   Underheated preforms will be too viscous initially and affect the sweep of the initial units. Overheated preforms will set up too quickly and affect the sweep of the final units and interfere with mold packing.
   Mold temperature has effects similar to preheat conditions. Low temperatures result in high viscosity, and high temperatures in rapid cure.
   Transfer pressure tends to affect only the final stages of filling and mold packing: the greater the pressure the more severe the sweep.
   A short transfer time (high transfer rate) will cause severe sweep; a long transfer time (low transfer rate) will permit a higher viscosity before the end of the cycle and hence less severe sweep.
   The ram height setting above the preform has a significant impact on the sweep since a high setting can effectively change a long apparent transfer time into a very short actual material transfer time.

Hi Density LOC Devices

Large, high density chips (in the region of 330×660 mils) together with the sub-micron wafer fabrication technology has meant that the properties required of the encapsulating compound differ somewhat from those of the previous generation devices. A better package integrity and thermal matching of the compound with the other assembly components require, amongst other things, increments in the filler content. This can improve significantly both its mechanical strength and the coefficient of thermal expansion which in turn reduces the package stress. A complete description of such compositions, and their use, appears in U.S. Pat. No. 4,632,798 incorporated herein by reference.

Although increments in the filler content tend to improve strength and reduce stress, they also increase the viscosity of the compound, leading to potential wire sweep problems as the following results appear to show.

These results are indicative of the need to reduce wire sweep in this new package: the manufacturing specification of 15% sweep (for conventional packages) was exceeded in many cases. For wire bonds that spanned over the buss bars, there is a potential risk of these wires collapsing onto these buss bars, causing an electrical short. This risk is naturally increased as the degree of wire sweep is increased, since a swept wire is more likely to collapse than one which is not. There is thus a need to reduce or eliminate this potential problem.

With all the bond pads aligned in a straight line at the centre of the chip, these devices are now found to be more amenable to a bond configuration that is less susceptible to wire sweep. Both lead frame design and bond pad locations at the periphery of the chip, as in the conventional packages, have been the main constraints for the most desirable wire bond configuration.

SUMMARY OF THE INVENTION

The degree of wire sweep and wire clearance over the buss bars in the LOC integrated circuit package is found to be dependent on the angle of the bond wires. A positive wire angle range of 5 to 15 degrees is critical for minimum wire sweep and maximum wire clearance over the buss bars. This is so because these wire angles offer the least resistance to the flow of the mold compound during transfer molding. In the mold, a staggered gating system ensures that the wire angles in all cavities are positive with respect to the gate.

DETAILED DESCRIPTION OF PREFERRED EMBODIMENTS

The bonding configuration is a critical factor for wire sweep reduction since there is room to optimize both the leadframe design and the bond pad locations. Experiments using test chips have shown the need for certain bond wire angles and lengths for minimum wire sweep.

Figure 1:
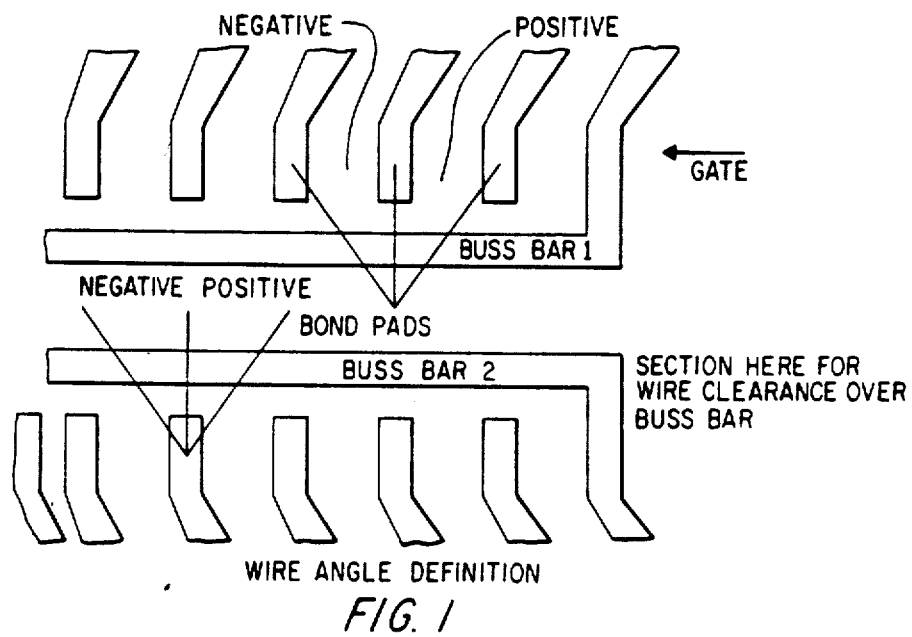
FIG. 1 is a schematic top-view of the leadframe fingers and buss bars on a high-density circuit chip, showing the definition of bond wire angles.

Thus, the approach taken in this invention is to utilize the wire bond angle necessary for a minimum wire sweep, i. e., to use a range of wire angles in which the resistance to plastic flow is minimum. The effects of filling time on wire sweep were also studied. With reference to FIG. 1 a wire is considered to have a positive angle if it inclines at a clockwise angle from an axis normal to the axis of the buss bar; negative if it inclines at a counter-clockwise angle from the said axis. Irrespective of the sign of the angle, an angle cannot exceed 90 degrees.

Wire angles ranging from −28 to 28 degrees were bonded and subsequently molded with 2 types of molding compounds of differing viscosities. In addition to the wire sweep which was measured from X-ray negatives, the clearance of the wires over the two buss bars were also measured. This was done by sectioning the samples up to the edge of the buss bars, in a direction parallel to the buss bars. The vertical distance between the sectioned wire and the buss bar is thus the clearance.

Results

Figure 2:
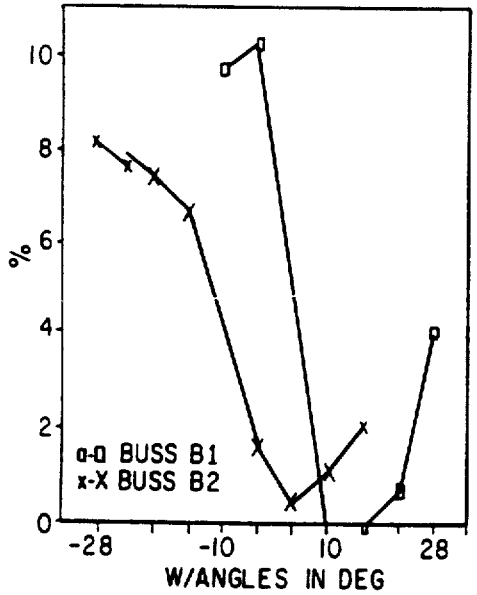
FIG. 2 is a graph showing bond wire sweep vs wire angles, for a first resin composition.
Figure 3:
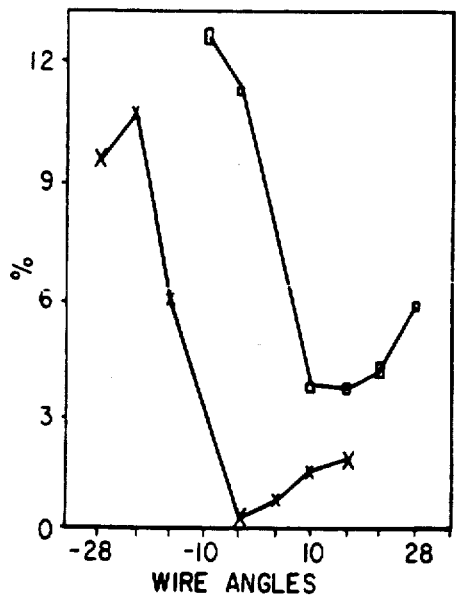
FIG. 3 is a graph showing bond wire sweep vs wire angles, for a second resin composition.
Figure 4:
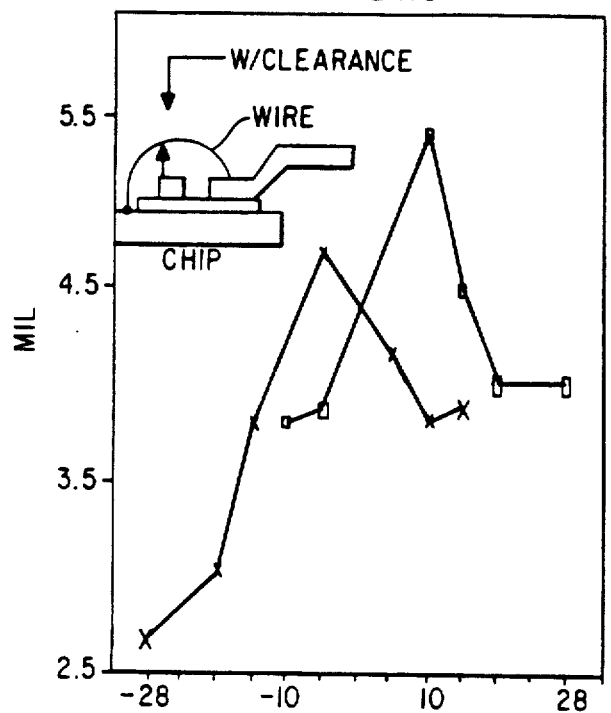
FIG. 4 is a graph showing bond wire clearance vs wire angles, for the composition of FIG. 2.

FIGS. 2 and 3 show the relation between wire sweep and the bond wire angle for 2 mold compounds. It is seen that a critical bond wire angle exists in which the wire sweep is minimum. FIG. 4 shows that the optimum wire angle is also one in which the wire clearance from the buss bars is maximum. On average the wire clearance is more than 2 times the wire diameter (1.2 mil). The degree of sweep in the wires spanning over the buss bar (buss bar 1) nearest to the gate from which the plastic melt enters the cavity is also more severe than those spanning over the buss bar (buss bar 2) away from the gate. This is attributable to the higher forces exerting on the wires nearer to the gate.

It is seen that a critical wire angle for minimum wire sweep exists for wires spanning over the 2 buss bars. In order to provide for some degree of flexibility, and taking into consideration the proximity of the wires to the gate, a wire angle range of +5 to +15 degrees is critical. Negative wire angles are not useful since they resist the plastic flow. The actual wire sweep for positive wire angles and those for negative angles were determined by X-ray microphotography, which confirmed the critical angles.

Mold Design Considerations

Figure 5:
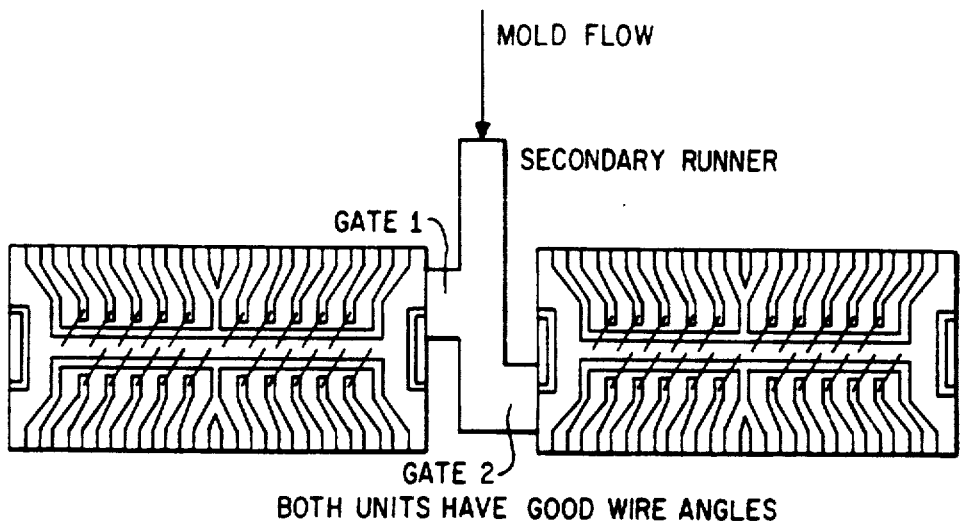
FIG. 5 is a schematic view showing two mold cavities, each containing a high-density chip for encapsulation, with staggered gating geometry in accordance with one embodiment of the invention.

Since a positive wire angle is critical, the gates must be strategically located such that a positive angle is maintained in all cavities. The solution was found to be a staggered gating arrangement of the type shown in FIG. 5. This ensures a positive wire angle and hence minimum wire sweep in all cavities. A gating design of the conventional type would mean positive wire angles for one cavity and negative angles for the other.

A concern arises in that the staggered gating could result in adverse mold flow patterns in each of the pair of cavities. A computer aided mold flow simulation shows that the differences to be very insignificant. Additionally, the flow patterns reinforce the need for a positive wire angle: positive wire angles offer the least resistance to plastic flow.

Conclusion

The following conclusions are drawn:
1. For an LOC package with center wire bond, a positive wire angle range of 5 to 15 degrees is necessary for minimum wire sweep, and is also applicable to other packages.
2. A suitable wire angle is also one in which the wire clearance from the buss bars is maximum which averages more than 2 times the wire diameter.
3. The staggered gating does not significantly alter the plastic flow patterns in the two adjoining cavities.

What is claimed is:

1. A semiconductor device including a circuit chip having bond wires that extend in part over an electrically active portion of the device, wherein the bond pads on the chip are located along a linear path at the center of the chip, and arranged in relation to the corresponding leadframe fingers such that the bond wires connecting the respective pads and fingers span the active portion at an angle of 5 to 15 degrees, measured in the chip surface with respect to a line in said surface perpendicular to the path along which the bonding pads are located, and wherein the bond wire lengths are selected to provide clearance over the chip of at least two times the wire diameter.

2. A device as in claim 1 wherein said bond wires are comprised of gold and beryllium.

3. A device as in claim 1 wherein said device is resin-encapsulated.

* * * * *